United States Patent
Teboulle et al.

(10) Patent No.: US 12,416,698 B2
(45) Date of Patent: Sep. 16, 2025

(54) METHOD OF ADJUSTING AN ELECTRICITY METER

(71) Applicant: SAGEMCOM ENERGY & TELECOM SAS, Rueil Malmaison (FR)

(72) Inventors: Henri Teboulle, Rueil Malmaison (FR); Christophe Grincourt, Rueil Malmaison (FR); Sébastien Noiret, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 156 days.

(21) Appl. No.: 18/102,360

(22) Filed: Jan. 27, 2023

(65) Prior Publication Data
US 2023/0236275 A1    Jul. 27, 2023

(30) Foreign Application Priority Data
Jan. 27, 2022   (FR) ...................................... 2200719

(51) Int. Cl.
*G01R 23/02*    (2006.01)
*G01R 22/10*    (2006.01)
*G01R 35/00*    (2006.01)

(52) U.S. Cl.
CPC ........... *G01R 35/005* (2013.01); *G01R 22/10* (2013.01)

(58) Field of Classification Search
CPC .............................. G01R 35/005; G01R 22/10
See application file for complete search history.

(56) References Cited

U.S. PATENT DOCUMENTS

| | | | |
|---|---|---|---|
| 4,303,881 A | 12/1981 | Czerwien et al. | |
| 4,766,370 A * | 8/1988 | Carr ....................... | G01R 35/04 340/637 |
| 6,377,037 B1 | 4/2002 | Burns et al. | |
| 7,962,298 B2 * | 6/2011 | Przydatek ............ | G01R 22/065 702/61 |
| 2018/0172741 A1 * | 6/2018 | Kang ..................... | G01R 11/24 |
| 2024/0250557 A1 * | 7/2024 | Levee .................. | G06Q 10/063 |

* cited by examiner

*Primary Examiner* — Alesa Allgood
(74) *Attorney, Agent, or Firm* — MUNCY, GEISSLER, OLDS & LOWE, P.C.

(57) ABSTRACT

A method of adjusting an electricity meter (1), the method comprising the steps of:
measuring the frequency of the distribution grid (3);
if the difference between the frequency of the distribution grid and a first frequency is less that a first predetermined threshold, adjusting the measurement module (10) by using first calibration parameters that were produced during a stage of calibrating the meter;
if the difference between the frequency of the grid and the first frequency is greater than or equal to the first predetermined threshold, calculating second calibration parameters from the first calibration parameters and from adaptation parameters, and adjusting the measurement module (10) by using the second calibration parameters.

12 Claims, 1 Drawing Sheet

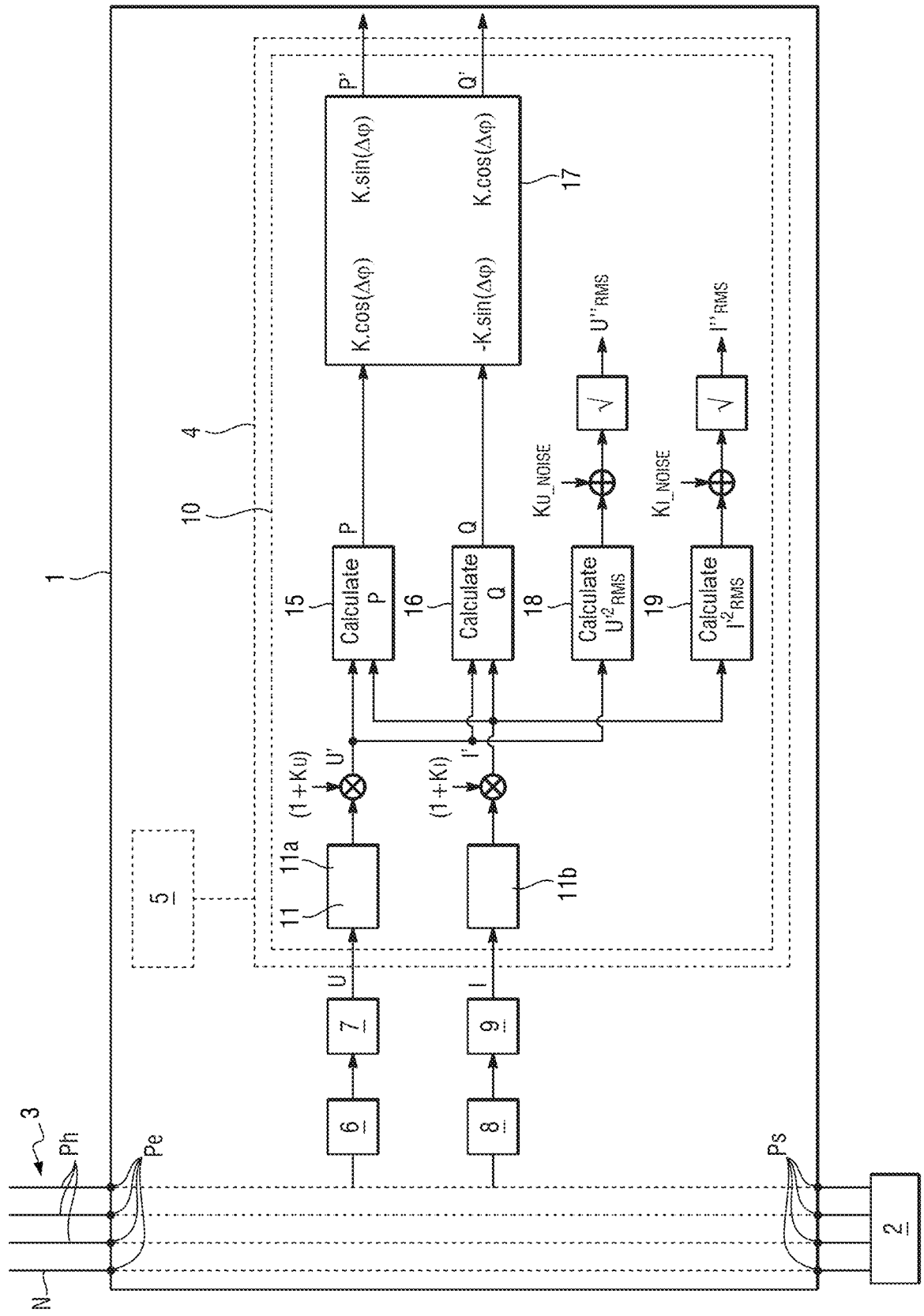

METHOD OF ADJUSTING AN ELECTRICITY METER

The invention relates to the field of electricity meters.

BACKGROUND OF THE INVENTION

Some electricity meters are specified and designed so as to be capable of operating in a plurality of countries having grids for distributing electrical energy that operate at different frequencies. Such meters must measure the electrical energy that is distributed with accuracy in compliance with the regulations in force each of those countries.

The frequencies of the grids in question are typically 50 hertz (Hz) and 60 Hz, and some meters must therefore comply simultaneously with several different standards. For measuring active energy in a 50 Hz country, the applicable standard for obtaining approval under the Measuring Instruments Directive (MID) is the EN 50470-3 standard, while in a 60 Hz country the IEC 62053-21 standard applies in the absence of an external current transformer and the IEC 62053-22 standard applies in the presence of an external current transformer. For measuring reactive energy, both in 50 Hz countries and in 60 Hz countries, the IEC 62053-24 standard is applicable, which standard covers both the absence and the presence of an external current transformer.

In general manner, all electricity meters are adjusted with calibration parameters that are defined in the factory. The calibration parameters are determined individually for each meter at the end of the meter-manufacturing stage, and they are stored in the meter.

However, the optimum values for some of those calibration parameters depend on the frequency of the distribution grid.

In order to enable a meter to be capable of ensuring the required levels of accuracy both at 50 Hz and at 60 Hz, one known solution consists in configuring the meter manually when it is put into service (50 Hz exclusive-OR 60 Hz). Two sets of calibration parameters are previously stored in the meter, one for 50 Hz and another 60 Hz, so as to avoid losing metrological accuracy in either situation. Such a meter is indeed considered to be MID-compliant in its 50 Hz configuration.

Nevertheless, during the calibration stage as performed in the factory, that solution requires measurements to be taken for producing two sets of calibration parameters (one for each frequency), and to do so for each meter that is manufactured. The duration of the calibration stage is not negligible (typically being of the order of a dozen minutes per meter and per frequency), so that solution increases the cost of manufacturing each meter significantly.

Another known solution consists in designing meters suitable for operating over a wide range of grid frequencies (typically 45 Hz to 65 Hz), which meters are thus compatible with the frequencies of 50 Hz and 60 Hz without requiring any configuration or adjustment on being put into service. Such meters thus have "median" calibration parameters, which leads to metrological accuracy that is degraded compared with a meter that is purely 50 Hz or purely 60 Hz.

OBJECT OF THE INVENTION

An object of the invention is thus to reduce the cost and improve the accuracy of an electricity meter that is suitable for being connected to grids of different frequencies.

SUMMARY OF THE INVENTION

In order to achieve this object, there is provided an adjustment method for adjusting a measurement module of an electricity meter connected to a distribution grid, the method comprising the following steps that are implemented in the electricity meter following installation of the electricity meter in an operating position:

acquiring at least one measurement of the frequency of the distribution grid;

if the difference between the frequency of the distribution grid and a first frequency is less that a first predetermined threshold, adjusting the measurement module by using first calibration parameters that were produced and stored in the electricity meter during a calibration stage performed prior to installing the meter in the operating position;

if the difference between the frequency of the distribution grid and the first frequency is greater than or equal to the first predetermined threshold, calculating second calibration parameters from the first calibration parameters and from adaptation parameters, and adjusting the measurement module by using the second calibration parameters.

Thus, on being put into service, the electricity meter measures the frequency of the distribution grid. If this frequency equal or very close to the first frequency, then the meter uses the first calibration parameters for adjusting the measurement module. Otherwise, the meter produces second calibration parameters that correspond to the measured frequency, and uses the second calibration parameters for adjusting the measurement module.

In both situations, the measurement module of the meter is adjusted with calibration parameters that are defined in accurate manner, taking account of the frequency of the distribution grid to which the meter is connected.

The meter is thus capable of taking measurements that are very accurate regardless of the frequency of the distribution grid. The stage of calibrating the meter in the factory is performed at a single frequency only (the first frequency) thereby reducing the cost of the meter.

There is also provided an adjustment method as described above, wherein the adaptation parameters comprise first adaptation parameters evaluated at the first frequency and second adaptation parameters evaluated at a second frequency, the second frequency being such that the difference between the frequency of the distribution grid and the second frequency is less that a second predetermined threshold.

There is also provided an adjustment method as described above, wherein, for each phase line of the distribution grid, the measurement module is arranged to acquire measurements of the phase voltage and of the phase current that are present on said phase line, the measurement module including at least one lowpass filter arranged to suppress harmonics from the phase voltage and from the phase current so as to produce the phase voltage and the phase current, the adaptation parameters comprising parameters for the lowpass filter.

There is also provided an adjustment method as described above, wherein the parameters for the lowpass filter comprise the modulus at the first frequency of a Z transform of a transfer function of the lowpass filter, and the modulus at the second frequency of said Z transform.

There is also provided an adjustment method as described above, wherein the first calibration parameters comprise first parameters $K_{U_1}$ and $K_{I_1}$, and the second calibration parameters comprise second parameters $K_{U_1}$ and $K_{I_2}$, which parameters are incorporated in multiplication factors used for multiplying the fundamental phase voltage and the fundamental phase current in order to evaluate the raw reactive power supplied by the distribution grid, the second calibration parameters $K_{U_2}$ and $K_{I_2}$ being obtained by calculating:

$$K_{U_2}=(1+K_{U_1})*(|H(Z)_1|/|H(Z)_2|)-1$$

$$K_{I_2}=(1+K_{I_1})*(|H(Z)_1|/|H(Z)_2|)-1$$

where $|H(Z)_1|$ is the modulus at the first frequency of the Z transform of the transfer function of the lowpass filter, and where $|H(Z)_2|$ is the modulus of the second frequency of the Z transform of the transfer function of the lowpass filter.

There is also provided an adjustment method as described above, wherein the parameters for the lowpass filter also comprise the phase at the first frequency of said Z transform, and the phase at the second frequency of said Z transform.

There is also provided an adjustment method as described above, the electricity meter including or being connected to a current sensor that includes a current transformer and that is arranged to produce the measurements of the phase current, the adaptation parameters also comprising at least one parameter for the current transformer.

There is also provided an adjustment method as described above, wherein the adaptation parameters also comprise at least one parameter for at least one electronic component of a current measurement circuit that is connected to the current transformer.

There is also provided an adjustment method as described above, wherein the electronic component is an amplifier.

There is also provided an adjustment method as described above, wherein the first calibration parameters also comprise the phase shift with harmonics $\Delta\varphi_{1\_Harmonics}$ and the fundamental phase shift $\Delta\varphi_{1\_Fundamental}$, and the second calibration parameters also comprise the phase shift with harmonics $\Delta\varphi_{2\_Harmonics}$ and the fundamental phase shift $\Delta\varphi_{2\_Fundamental}$, which calibration parameters are used by the measurement module to evaluate a compensated active power and a compensated reactive power as delivered by the distribution grid, the phase shift with harmonics $\Delta\varphi_{2\_Harmonics}$ and the fundamental phase shift $\Delta\varphi_{2\_Fundamental}$ being obtained by calculating:

$$\Delta\varphi_{2\_Fundamental}=\Delta\varphi_{1\_Fundamental}+(\varphi(H(Z))_2-\varphi(H(Z))_1)+\\(\varphi_{Trans\_2}-\varphi_{Trans\_1})+(\varphi_{Amp\_2}-\varphi_{Amp\_1})$$

and $$\Delta\varphi_{2\_Harmonics}=\Delta\varphi_{1\_Harmonics}+(\varphi_{Trans\_2}-\varphi_{Trans\_1})+\\(\varphi_{Amp\_2}-\varphi_{Amp\_1})$$

where $\varphi(H(Z))_1$ is the phase of the Z transform at the first frequency, $\varphi(H(Z))_2$ is the phase of the Z transform at the second frequency, $\varphi_{Trans\_1}$ is the phase at the first frequency of the current transformer, $\varphi_{Trans\_2}$ is the phase at the second frequency of the current transformer, $\varphi_{Amp\_1}$ is the phase at the first frequency of the amplifier of the current measurement circuit, and $\varphi_{Amp\_2}$ is the phase at the second frequency of the amplifier of the current measurement circuit.

There is also provided an adjustment method as described above, wherein, for each phase line of the distribution grid, the meter is arranged to measure and sample the phase voltage and the phase current present on said phase line, so as to produce measurements of the phase voltage and of the phase current present on said phase line, the sampling frequency being a multiple both of the first frequency and of the second frequency.

There is also provided an electricity meter including a measurement module and a processor component in which the adjustment method as described above is implemented.

There is also provided a computer program including instructions that cause the processor component of the meter as described above to execute the steps of the adjustment method as described above.

There is also provided a computer-readable storage medium, storing the above-described computer program.

The invention can be better understood in the light of the following description of a particular, nonlimiting implementation of the invention.

BRIEF DESCRIPTION OF THE DRAWING

Reference is made to the sole FIGURE of the accompanying drawing:

The sole FIGURE shows an electricity meter in which the adjustment method of the invention is implemented.

DETAILED DESCRIPTION OF THE INVENTION

With reference to the sole FIGURE, the electricity meter 1 of the invention is a three-phase meter for measuring the consumption of energy supplied to a subscriber's electrical installation 2 by a distribution grid 3.

The distribution grid 3 has three phase lines Ph (for phases 1, 2, and 3) together with one neutral line N.

The frequency of the distribution grid may be equal either to 50 Hz (or very close to 50 Hz), or else to 60 Hz (or very close to 60 Hz).

The meter 1 has three input ports Pe, each connected to a respective one of the phase lines Ph of the distribution grid 3, and one input port Pe connected to the neutral line N. The meter 1 also has four output ports Ps that are connected to the installation 2 (three for the phase lines and one for the neutral line).

The meter 1 has an application portion and a metrological portion. This description relates to the metrological portion.

The metrological portion comprises firstly a processor component, which, by way of example, is a general-purpose processor, a processor specialized in signal processing (known as a digital signal processor (DSP)), a microcontroller, or indeed a programmable logic circuit such as a field programmable gate array (FPGA) or an application-specific integrated circuit (ASIC).

In this example, the processor component is a microcontroller 4 ("measurement microcontroller").

The metrological portion also comprises one or more memories 5 that are connected to, or incorporated in, the microcontroller 4. At least one of the memories 5 forms a computer-readable storage medium storing a computer program including instructions that enable the microcontroller 4 to execute at least some of the steps of the adjustment method that is described below.

In addition to the microcontroller 4, the metrological portion comprises, for each phase line Ph of the distribution grid 3, a voltage sensor 6, a voltage measurement circuit 7 connected to the voltage sensor 6, a current sensor 8, a current measurement circuit 9 connected to the current sensor 8, and a measurement module 10. In the sole FIGURE, the elements 6 to 10 are shown for only one of the phase lines Ph, but the meter 1 has such elements for each of the phase lines Ph. Implementation of the invention is described below for only one phase line Ph, however it is implemented in the same manner for each of the other phase lines Ph.

The voltage sensor 6 comprises resistors forming a voltage divider bridge suitable for producing, from the voltage of the grid 3, a voltage that is less than or equal to 3.3 V. The voltage measurement circuit 7 comprises a first analog-to-digital converter (ADC). The voltage measurement circuit 7 produces measurements of the phase voltage U that is present on the phase line Ph.

The current sensor 8 comprises a current transformer. The current measurement circuit 9 comprises a second ADC and electronic components comprising at least one amplifier. The current measurement circuit 9 produces measurements of the phase current I flowing in the phase line Ph.

The measurement module 10 is a digital module that is implemented in the measurement microcontroller 4 of the meter 1. The measurement module 10 is connected to the voltage measurement circuit 7 and to the current measurement circuit 9.

The measurement module 10 includes at least one lowpass filter 11 arranged to suppress the harmonics from the phase voltage and from the phase current so as to produce the phase voltage and the phase current.

Specifically, the measurement module 10 comprises a first lowpass filter 11a that is connected to the voltage measurement circuit 7, and a second lowpass filter 11b that is connected to the current measurement circuit 9.

In this example, the first and second lowpass filters 11a and 11b are two identical Butterworth filters. It is thus considered to be a duplicated single filter 11.

In order to filter the fundamental frequency (both for voltages and for currents, and both for "fundamental" calibration and for measuring reactive energy), the filter 11 that is used is a first-order Butterworth filter H(Z) that is identical both at 50 Hz and at 60 Hz.

The Z transform of a first-order Butterworth filter is expressed as follows:

$$H(Z) = \frac{1+Z^{-1}}{1-a \cdot Z^{-1}} \text{ with } Z = e^{\frac{j \cdot 2 \cdot \pi \cdot f}{f_E}}$$

The coefficient "a" of the filter is selected so as to have a 3 dB cut-off frequency of 75 Hz.

In order to obtain a 3 dB cut-off frequency of 75 Hz when the sampling frequency $f_E$=3000 Hz, the following value is selected:

$a$=0.833033065947701.

The measurement module 10 also comprises a plurality of calculation modules, serving to evaluate the active power, the reactive power, the root mean square (RMS) voltage and the RMS current distributed by the distribution grid 3 via the phase line Ph. The measurement module 10 also makes use of a certain number of calibration parameters in order to perform these calculations. The calibration parameters are as follows: K, $K_U$, $K_I$, $K_{U\_NOISE}$, $K_{I\_NOISE}$, $\Delta\varphi$.

The phase voltage U is multiplied by a multiplication factor incorporating the voltage parameter $K_U$, in order to obtain a compensated voltage U'. The multiplication factor is equal to $(1+K_U)$.

The phase current I is multiplied by a multiplication factor incorporating the current parameter $K_I$, in order to obtain a compensated current I'. The multiplication factor is equal to $(1+K_I)$.

The module 15 acquires the compensated voltage U' and the compensated current I' and it produces a raw active power P.

The module 16 acquires the compensated voltage U' and the compensated current I' and it produces a raw reactive power Q.

The module 17, which is in the form of a matrix, acquires the raw active power P and the raw reactive power Q and it evaluates a compensated measurement of the active power P' and a compensated measurement of the reactive power Q', by calculating:

$P'=K \cdot \cos(\Delta\varphi) \cdot P + K \cdot \sin(\Delta\varphi) \cdot Q$ $Q'=-K \cdot \sin(\Delta\varphi) \cdot P + K \cdot \cos(\Delta\varphi) \cdot Q$ The module 18 acquires the compensated voltage U' and it calculates the RMS voltage squared: $U'_{RMS}{}^2$. The parameter $K_{U\_NOISE}$ is added to the RMS voltage squared, and then the square root of this addition is calculated, in order to obtain the compensated RMS voltage $U''_{RMS}$.

The module 19 acquires the compensated current, and it calculates the RMS current squared: $I'_{RMS}{}^2$. The parameter $K_{I\_NOISE}$ is added to the RMS current squared, and then the square root of this addition is calculated, in order to obtain the compensated RMS current $I''_{RMS}$.

The calibration parameter $K_U$ compensates the variations in the gain applied to the phase voltage that are due to the components of the voltage measurement circuit 7 at the output from the first ADC (and in particular due to the tolerances on the resistances of the resistors). It is applied after offset elimination in order to avoid applying gain to the offset.

The calibration parameter $K_I$ compensates variations in the gain applied to the phase voltage that are due to the components of the current measurement circuit 9 at the output from the second ADC (and in particular due to the tolerances on the resistances of the resistors). It is applied after offset elimination in order to avoid applying gain to the offset.

The parameters $K_U$ and $K_I$ are signed.

The calibration parameter $K_{U\_NOISE}$ compensates the effects of the white noise that is intrinsic to the meter 1, and also of the quantizing noise of the first ADC on the measurements of the RMS voltage of the phase line Ph. It should be observed that, in the great majority of the circumstances, $K_{U\_NOISE}$=0.

The calibration parameter $K_{I\_NOISE}$ compensates the effects of the white noise that is intrinsic to the meter 1, and also of the quantizing noise of the second ADC on the measurements of the RMS voltage of the phase line Ph. In general, $K_{I\_NOISE}$=0 for high-current ranges.

The calibration parameter K compensates gain variations in the voltage measurement circuit 7 and in the current measurement circuit 9.

The calibration parameter $\Delta\varphi$ compensates phase variations in the voltage measurement circuit 7 and in the current measurement circuit 9, and in particular the phase variations that are due to the internal transformers.

More generally, the parameters K and $\Delta\varphi$ serve to compensate the measurement so that it is insensitive to the gains and the phase shifts applied by the acquisition device as a whole: i.e. the sensors and the electronic components of the measurement circuits.

The measurement module 10 performs certain calculations by making use of the phase voltage U with harmonics and of the phase current I with harmonics; under such circumstances, the measurement module does not make use of the lowpass filters 11a and 11b (the filters are "bypassed").

The measurement module 10 also performs calculations by making use of the fundamental phase voltage U (i.e. without harmonics) and of the fundamental phase current I (i.e. without harmonics); under such circumstances, the measurement module 10 makes use of the lowpass filters 11a and 11b. For example, the reactive power is measured by using the fundamental phase voltage and the fundamental phase current. The lowpass filters 11a and 11b are also used for performing the "fundamental" calibration, as described below.

Thus, in reality, there are two sets of calibration parameters (associated with the same frequency):
 the calibration parameters "with harmonics" K, $K_U$, $K_I$, $K_{U\_NOISE}$, $K_{I\_NOISE}$, and $\Delta\varphi$; and
 the "fundamental" calibration parameters K, $K_U$, $K_I$, $K_{U\_NOISE}$, $K_{I\_NOISE}$, and $\Delta\varphi$.

In operation, the calibration parameters "with harmonics" are used for adjusting the measurement module 10 while it is performing measurements "with harmonics"—i.e. without using the lowpass filters 11a and 11b.

In operation, the "fundamental" calibration parameters are used for adjusting the measurement module 10 while it is performing "fundamental" measurements—i.e. while using the first lowpass filter 11a and/or the second lowpass filter 11b.

Usually, the calibration parameters are defined and then stored in the meter 1 during a calibration stage that is performed in the factory, after the stage of manufacturing the meter 1, and thus before the meter is delivered and installed in its operating position on client premises (the position where it is put into service).

In order to ensure that the measurements taken by the meter 1 are sufficiently accurate, it is essential for the calibration parameters to be defined while taking account of the frequency of the distribution grid 3.

However, as mentioned above, the meter 1 is to be capable of being connected either to a distribution grid having a first frequency, specifically 50 Hz, or else to a distribution grid having a second frequency, specifically 60 Hz.

During the calibration stage, the calibration parameters are produced and stored in the meter 1 solely for the first frequency (50 Hz): they are referred to as the "first" calibration parameters.

The meter 1 is then delivered, and subsequently installed in its operating position and activated. Activation of the meter 1 is followed by a short initialization period (of duration typically equal to 5 seconds (s)). The acquisition of metrological measurements starts after this initialization period.

The adjustment method of the invention is performed during the initialization period, and has the purpose of defining the calibration parameters that are to be used for adjusting the measurement module 10.

The microcontroller 4 acquires at least one measurement of the frequency of the distribution grid. The microcontroller 4 is naturally able to perform this or these measurements itself.

The frequency that is measured is the frequency of the phase voltage on the first phase line. If there is no voltage on the first phase line, then the meter 1 measures the frequency on the second phase line. If there is no voltage on the second phase line, then the meter 1 measures the frequency on the third phase line.

If the difference between the frequency of the distribution grid 3 and the first frequency (50 Hz) is less than a first predetermined threshold, then the microcontroller 4 adjusts the measurement module 10 using the first calibration parameters. By way of example, the first predetermined threshold may lie the range 1 Hz to 5 Hz.

If the difference between the frequency of the distribution grid 3 and the first frequency is greater than the first predetermined threshold, then the microcontroller 4 adjusts the measurement module 10 using the second calibration parameters.

In order to determine that the frequency of the distribution grid 3 does indeed correspond to 60 Hz, the microcontroller 4 verifies that the difference between the frequency of the distribution grid 3 and the second frequency is less that a second predetermined threshold (which may be equal to the first predetermined threshold, for example).

If so, the microcontroller 4 calculates the second calibration parameters from the first calibration parameters and from adaptation parameters.

The adaptation parameters comprise first adaptation parameters evaluated at the first frequency and second adaptation parameters evaluated at the second frequency.

It should be observed that, among the calibration parameters used in this example, there are some that are independent of the frequency of the distribution grid 3 (and thus do not need to be recalculated): these are the calibration parameters "with harmonics" K, $K_U$, $K_I$, $K_{U\_NOISE}$, and $K_{I\_NOISE}$, and the "fundamental" calibration parameters K, $K_{U\_NOISE}$, and $K_{I\_NOISE}$.

However, the "fundamental" calibration parameters $K_U$ and $K_I$ do depend on the frequency of the distribution grid 3. The microcontroller 4 thus produces the second "fundamental" calibration parameters $K_{U_2}$ and $K_{I_2}$ from the first calibration parameters $K_{U_1}$ and $K_{I_1}$.

Likewise, the "fundamental" calibration parameter $\Delta\varphi$ depends on the frequency of the distribution grid 3. The microcontroller 4 thus produces the second "fundamental" calibration parameter $\Delta\varphi_{2\_fundamental}$ (fundamental phase shift) from the first "fundamental" calibration parameter $\Delta\varphi_{1\_Fundamental}$.

Likewise, the calibration parameter "with harmonics" $\Delta\varphi$ depends on the frequency of the distribution grid 3. The microcontroller 4 thus produces the second calibration parameter "with harmonics" $\Delta\varphi_{2\_Harmonics}$ (phase shift with harmonics) from the first calibration parameter "with harmonics" $\Delta\varphi_{1\_Harmonics}$.

The adaptation parameters include parameters for the lowpass filter 11.

The parameters for the lowpass filter 11 comprise both the modulus at the first frequency of the Z transform of the transfer function of the lowpass filter 11, and also the modulus at the second frequency of said Z transform.

As mentioned above, the first calibration parameters include first parameters $K_{U_1}$ and $K_{I_1}$, and the second calibration parameters include second parameters $K_{U_2}$ and $K_{I_2}$, which parameters are incorporated in multiplication factors used for multiplying the fundamental phase voltage U and the fundamental phase current I in order to evaluate the raw reactive power Q supplied by the distribution grid 3. The second parameters $K_{U_2}$ and $K_{I_2}$ are obtained by calculating:

$$K_{U_2}=(1+K_{U_1})*(|H(Z)_1|/|H(Z)_2|)-1$$

$$K_{I_2}=(1+K_{I_1})*(|H(Z)_1|/|H(Z)_2|)-1$$

where $|H(Z)_1|$ is the modulus at the first frequency of the Z transform of the transfer function of the lowpass filter 11, and where $|H(Z)_2|$ is the modulus at the second frequency of the Z transform of the transfer function of the lowpass filter 11.

The adaptation parameters thus include the moduluses $|H(Z)_1|$ and $|H(Z)_2|$.

The phase shifts $\Delta\varphi_{2\_Harmonics}$ and $\Delta\varphi_{2\_Fundamental}$ are obtained as follows.

The adaptation parameters include other parameters for the lowpass filter 11, and specifically its phase at the first frequency of the Z transform of the transfer function of the lowpass filter 11 and its phase at the second frequency of said Z transform.

At the fundamental frequency, account is thus taken of:

$$\varphi(H(Z))_2 - \varphi(H(Z))_1,$$

where $\varphi(H(Z))_1$ is the phase at the first frequency of the Z transform and $\varphi(H(Z))_2$ is the phase at the second frequency of the Z transform.

The adaptation parameters also include parameters of the current transformer (of the current sensor 8).

Account is taken of the difference in phase shift of the current transformer at the first frequency (50 Hz) and at the second frequency (60 Hz):

$$\varphi_{Trans\_2} - \varphi_{Trans\_1};$$

where $\varphi_{Trans\_1}$ is the phase at the first frequency of the current transformer, and $\varphi_{Trans\_2}$ is the phase at the second frequency of said current transformer.

These parameters are supplied by the manufacturer or the supplier of the transformers, and they are therefore previously stored in the meter 1.

The adaptation parameters also include parameters for at least one electronic component of the current measurement circuit 9 that is connected to the current transformer. These electronic components include an amplifier.

Account is thus taken of the difference in phase shift associated with the operational amplifier at the first frequency (50 Hz) and at the second frequency (60 Hz), and as determined at the design stage:

$$\varphi_{Amp\_2} - \varphi_{Amp\_1};$$

where $\varphi_{Amp\_1}$ is the phase of the amplifier in the current measurement circuit 9 at the first frequency, and $\varphi_{Amp\_2}$ is the phase of said amplifier at the second frequency.

The microcontroller 4 then calculates:

$$\Delta\varphi_{2Fundamental} = \Delta\varphi_{1Fundamental} + (\varphi(H(Z))_2 - \varphi(H(Z))_1) + (\varphi_{Trans\_2} - \varphi_{Trans\_1}) + (\varphi_{Amp\_2} - \varphi_{Amp\_1})$$

and $$\Delta\varphi_{2\_Harmonics} = \Delta\varphi_{1\_Harmonics} + (\varphi_{Trans\_2} - \varphi_{Trans\_1}) + (\varphi_{Amp\_2} - \varphi_{Amp\_1}).$$

Naturally, once the microcontroller 4 has "decided" at the second calibration parameters are to be used, this selection is made permanent (the frequency of the grid does not vary significantly), and once the second calibration parameters have been defined, they are stored in a memory of the metrological portion (e.g. a flash memory).

The meter 1 thus calibrates the measurement module 10 automatically as a function of the frequency of the distribution grid 3.

As explained above, for each phase line Ph, the voltage measurement circuit 7 has a first ADC and the current measurement circuit 9 has a second ADC.

For each phase line Ph, the meter 1 thus measures and samples the phase voltage and the phase current that are present on said phase line Ph, in order to produce measurements of the phase voltage U and of the phase current I present on said phase line Ph. These measurements are then transmitted to the measurement module 10.

Advantageously, the sampling frequency is a multiple both of the first frequency and of the second frequency. In this example, sampling is performed at 3000 Hz, thereby processing 60 samples per period at 50 Hz and 50 samples per period at 60 Hz. The fact that this comes out "exactly" serves to avoid any fluctuation in the power and energy measurements over "one second" corresponding to sampling 3000 samples.

Naturally, the invention is not limited to the implementation described but covers any variant coming within the ambit of the invention as defined by the claims.

The above description relates to one particular implementation, in which the first calibration parameters (as predefined and previously stored) are the parameters for 50 Hz, while the second calibration parameters (as defined, where necessary, when putting the meter into service) are the parameters for 60 Hz. Naturally, it would be entirely possible to calibrate at 60 Hz and to deduce the calibration parameters for 50 Hz.

The same principle can naturally be applied to grid frequencies other than 50 Hz and 60 Hz, and can likewise be applied while taking account of more than two grid frequencies on starting, the principal continuing to be that of using first calibration parameters at a first frequency for deducing calibration parameters at other frequencies. It is then advantageous to select the sampling frequency in such a manner that the number of samples per period is an integer at all of the frequencies. The coefficient "a" of the Butterworth filter is then also adapted.

The calibration parameters used while implementing the invention may be different from those described above. For example, it is not necessary to use the matrix 17 under all circumstances.

The lowpass filters 11a and 11b need not necessarily be identical, and they need not necessarily be Butterworth filters. Other filters could be used, such as Chebyshev filters. The Butterworth filter has the advantage of "rejecting" quite quickly, and of presenting gain in the passband is relatively constant.

Naturally, the electricity meter in which the invention is implemented need not necessarily be a three-phase meter. It could be a single-phase meter. Under such circumstances, the circuit diagram of the sole FIGURE is applicable for the single phase line Ph.

The invention claimed is:

1. An adjustment method for adjusting a measurement module of an electricity meter connected to a distribution grid, the method comprising the following steps that are implemented in the electricity meter following installation of the electricity meter in an operating position:
acquiring at least one measurement of the frequency of the distribution grid;
if the difference between the frequency of the distribution grid and a first frequency is less that a first predetermined threshold, adjusting the measurement module by using first calibration parameters that were produced and stored in the electricity meter during a calibration stage performed prior to installing the meter in the operating position;
if the difference between the frequency of the distribution grid and the first frequency is greater than or equal to the first predetermined threshold, calculating second calibration parameters from the first calibration parameters and from adaptation parameters, and adjusting the measurement module by using the second calibration parameters, the adaptation parameters comprising first adaptation parameters evaluated at the first frequency and second adaptation parameters evaluated at a second frequency, the second frequency being such that the difference between the frequency of the distribution grid and the second frequency is less that a second predetermined threshold.

2. The adjustment method according to claim 1, wherein, for each phase line (Ph) of the distribution grid, the meter is arranged to measure and sample the phase voltage and the phase current present on said phase line, so as to produce measurements of the phase voltage and of the phase current present on said phase line, the sampling frequency being a multiple both of the first frequency and of the second frequency.

3. The adjustment method according to claim 1, wherein, for each phase line of the distribution grid, the measurement module is arranged to acquire measurements of the phase voltage and of the phase current that are present on said phase line, the measurement module including at least one lowpass filter arranged to suppress harmonics from the phase voltage and from the phase current so as to produce the fundamental phase voltage and the fundamental phase current, the adaptation parameters comprising parameters for the lowpass filter.

4. The adjustment method according to claim 3, wherein the parameters for the lowpass filter comprise the modulus at the first frequency of a Z transform of a transfer function of the lowpass filter, and the modulus at the second frequency of said Z transform.

5. The adjustment method according to claim 4, wherein the first calibration parameters comprise first parameters $K_{U_1}$ and $K_{I_1}$, and the second calibration parameters comprise second parameters $K_{U_2}$ and $K_{I_2}$, which parameters are incorporated in multiplication factors used for multiplying the fundamental phase voltage and the fundamental phase current in order to evaluate the raw reactive power supplied by the distribution grid, the second calibration parameters $K_{U_2}$ and $K_{I_2}$ being obtained by calculating:

$$K_{U_2}=(1+K_{U_1})*(|H(Z)_1|/|H(Z)_2|)-1$$

$$K_{I_2}=(1+K_{I_1})*(|H(Z)_1|/|H(Z)_2|)-1$$

where $|H(Z)_1|$ is the modulus at the first frequency of the Z transform of the transfer function of the lowpass filter (11), and where $|H(Z)_2|$ is the modulus of the second frequency of the Z transform of the transfer function of the lowpass filter.

6. The adjustment method according to claim 4, wherein the parameters for the lowpass filter also comprise its phase at the first frequency of said Z transform, and its phase at the second frequency of said Z transform.

7. The adjustment method according to claim 6, the electricity meter including or being connected to a current sensor that includes a current transformer and that is arranged to produce the measurements of the phase current, the adaptation parameters also comprising at least one parameter for the current transformer.

8. The adjustment method according to claim 7, wherein the adaptation parameters also comprise at least one parameter for at least one electronic component of a current measurement circuit that is connected to the current transformer.

9. The adjustment method according to claim 8, wherein the electronic component is an amplifier.

10. The adjustment method according to claim 9, wherein the first calibration parameters also comprise the phase shift with harmonics $\Delta\varphi_{1_{Harmonics}}$ and the fundamental phase shift $\Delta\varphi_{1_{Fundamental}}$, and the second calibration parameters also comprise the phase shift with harmonics $\Delta\varphi_{2_{Harmonics}}$ and the fundamental phase shift $\Delta\varphi_{2_{Fundamental}}$, which calibration parameters are used by the measurement module to evaluate a compensated active power and a compensated reactive power as delivered by the distribution grid, the phase shift with harmonics $\Delta\varphi_{2_{Harmonics}}$ and the fundamental phase shift $\Delta\varphi_{2_{Fundamental}}$ being obtained by calculating:

$$\Delta\varphi_{2_{Fundamental}}=\Delta\varphi_{1_{Fundamental}}+(\varphi(H(Z))_2-\varphi(H(Z))_1)+(\varphi_{Trans\_2}-\varphi_{Trans\_1})+(\varphi_{Amp\_2}-\varphi_{Amp\_1})$$

and $$\Delta\varphi_{2\ Harmonics}=\Delta\varphi_{1\ Harmonics}+(\varphi_{Trans\ 2}-\varphi_{Trans\ 1})+(\varphi_{Amp\_2}-\varphi_{Amp\_1})$$

where $\varphi(H(Z))_1$ is the phase of the Z transform at the first frequency, $\varphi(H(Z))_2$ is the phase of the Z transform at the second frequency, $\varphi_{Trans\_1}$ is the phase at the first frequency of the current transformer, $\varphi_{Trans\_2}$ is the phase at the second frequency of the current transformer, $\varphi_{Amp\_1}$ is the phase at the first frequency of the amplifier of the current measurement circuit, and $\varphi_{Amp\_2}$ is the phase at the second frequency of the amplifier of the current measurement circuit.

11. The electricity meter including a measurement module and a processor component in which the adjustment method according to claim 1 is implemented.

12. A non-transitory computer-readable storage medium storing a computer program including instructions that cause the processor component of the electricity meter according to claim 11 to execute the steps of the adjustment method.

* * * * *